United States Patent
Inubushi et al.

(10) Patent No.: US 6,528,941 B1
(45) Date of Patent: Mar. 4, 2003

(54) ELECTROLUMINESCENT DEVICE AND SHIELD THEREFOR

(75) Inventors: Toshiya Inubushi, Tokyo (JP); Tsutomu Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/284,624

(22) PCT Filed: Jul. 6, 1998

(86) PCT No.: PCT/JP98/03036

§ 371 (c)(1),
(2), (4) Date: Apr. 16, 1999

(87) PCT Pub. No.: WO99/25157

PCT Pub. Date: May 20, 1999

(30) Foreign Application Priority Data

Nov. 12, 1997 (JP) .............................................. 9-310298

(51) Int. Cl.⁷ .............................................. H05B 33/08
(52) U.S. Cl. ....................... 313/506; 313/511; 313/512; 345/80

(58) Field of Search ................................. 313/504, 505, 313/506, 507, 509, 510, 511, 512; 349/59, 69; 455/300

(56) References Cited

U.S. PATENT DOCUMENTS 5,899,549 A * 5/1999 Nakanishi et al. ............ 349/59

FOREIGN PATENT DOCUMENTS

| JP | 6215713 | 1/1987 |
| JP | 993324 | 4/1997 |
| JP | 09152605 | 6/1997 |
| JP | 9-218649 | 8/1997 |
| JP | 10022070 | 1/1998 |

* cited by examiner

Primary Examiner—Michael H. Day
Assistant Examiner—Mack Haynes
(74) Attorney, Agent, or Firm—Rothwell, Figg, Ernst & Manbeck

(57) ABSTRACT

The generation of noise due the excitation of electronic circuits on a printed circuit board disposed in close proximity to the rear face of an EL as a result of a high voltage alternating current is prevented by the formation of a shield layer on the rear face of the EL.

8 Claims, 4 Drawing Sheets

ELECTROLUMINESCENT DEVICE AND SHIELD THEREFOR

FIELD OF THE INVENTION

The present invention relates to an electro-luminescent light and shield for use in the illumination and display of an electronic device.

BACKGROUND TO THE INVENTION

Electro-luminescent lights (hereafter EL) are used in the illumination of the key button from its rear side and the illumination of the display which carries out all kinds of display operations. Since Els represent a thin and relatively bright light source, they have often been used in recent years particularly in electronic devices where small size and thinness is desirable. However it is necessary to provide a solution to the noise and vibration generated by those Els which emit light due to the supply of a high voltage alternating current at the level of 600 HZ and 150V.

Up until the present time, an interference material has been provided in the EL as a solution to vibration problems. However as regards noise, due to the fact that it was rare for the electronic circuits to be in close proximity to the EL, no particular problem arose and no solution has been advanced. However as shown by JP-A-SHO-62-15713 and JP-A-HEI-9-93324, in an electronic device in which small size and thinness are desirable, as the electronic components are installed in high density, the printed circuit board is sometimes in close proximity to the EL. Hence the high voltage alternating current supplied to the EL excites the electronic circuits on the printed circuit board and the problem arose that noise was generated. In particular when the EL illuminates the key button, there is the problem that noise is superimposed on the on-off signal of the key button and an error signal may be generated.

The present invention is proposed in order to solve the above problems and has the purpose of providing an EL and a shield device therfor which prevents the generation of noise in a circuit of a printed circuit board which is disposed in close proximity to the EL.

DISCLOSURE OF THE INVENTION

The structure of the shield of the electro-luminescent light of the present invention comprises a printed circuit board on which is mounted the electronic components, an electro-luminescent light which is placed in close proximity to the printed circuit board and illuminates due to the application of a high voltage alternating current, and a shield member which is provided between the electro-luminescent light and the printed circuit board and shields the high voltage alternating current which is applied to the electro-luminescent light.

In this way, it is possible to prevent the generation of noise in the electronic circuit on the printed circuit board.

The structure of the shield of the electro-luminescent light of the present invention comprises a click board on top of the printed circuit board for placing the contact points of the switches in the on-off position by the depression of a plurality of key buttons arranged in parallel and a shield member placed between the electro-luminescent light and the click board and between the electro-luminescent light and the printed circuit board.

In such a way it is possible to prevent the generation of noise in the electronic circuits on the printed circuit board, particularly noise in the on-off signals generated by the operation of the key buttons.

The structure of the shield of the electro-luminescent light of the present invention comprises a shield member constructed by a shield layer printed into the bracing seat used for fixing the click board to the printed circuit board.

Hence this structure has the advantage that it is easy to assemble a device with a shield layer.

The structure of the shield of the electro-luminescent light of the present invention comprises a shield member which is constructed by a shield layer printed onto the rear face of the electro-luminescent light.

Hence it is possible to printed the shield layer in tandem with the electro-luminescent light fabrication process.

The structure of the shield of the electro-luminescent light of the present invention comprises a shield layer printed in carbon ink.

Hence it is possible to prevent the generation of noise in the electronic circuits on the printed circuit board at a low cost.

The structure of the shield of the electro-luminescent light of the present invention comprises a shield member electrically connected to the shield line wired printed onto the printed circuit board.

Hence it is possible to again improve the effects of the shield.

The structure of the shield of the electro-luminescent light of the present invention is electrically connected by crimping an electrically conductive adhesive, which is printed onto the shield member, to the shield line on the printed circuit board.

Hence it is possible to easily perform connecting operations.

The structure of the shield of the electro-luminescent light of the present invention uses a shield member as a shield layer which is printed onto the rear surface of the electroluminescent light. Furthermore the partial regions on the peripheral edge of the electro-luminescent light are not laminated with the luminant layer which comprises the electro-luminescent light. The device is electrically connected by crimping the shield layer to the shield line on the printed circuit board through the conductive adhesive which is printed on the shield layer corresponding to the partial regions.

Hence it is possible to prevent the generation of cracks in the light generating layer.

The structure of the shield of the electro-luminescent light of the present invention comprises an electro-luminescent light which generates light due to the application of a high voltage alternating current, a holder, the face of which is formed on the shield member and which abuts with the electro-luminescent light, a positional determination member which is formed from an insulating material as a unit with the electro-luminescent light, abuts with the holder, and determines the position of the electro-luminescent light so that the end face of the electro-luminescent light does not come into contact with the surface of the holder, and a printed circuit board which is disposed in close contact with the holder and on which are mounted the electronic circuits.

Hence each layer of the end face of the electro-luminescent light does not come into contact with the shield member on the surface of the holder and the shield effect is not diminished.

The structure of the shield of the electro-luminescent light of the present invention comprises an electro-luminescent light which generates light due to the application of a high voltage alternating current, a crystal display element which is illuminated from its rear face side by the electro-luminescent light, a flexible printed board one end of which is connected to the end of the crystal display element and on the face of which are mounted the electronic circuit elements, a shield member formed on the rear face of the flexible printed board, and a holder which bends the flexible printed board on the rear face of the crystal display element and pushes the electro-luminescent light in an abutting state into the space between the rear face of the flexible printed board and the rear face of the crystal display element.

Hence the generation of noise in the electronic circuits on the flexible printed board can be prevented.

The electro-luminescent light of the present invention is comprised of a transference electrode, a ruminant layer, a dielectric layer and a back plate and an insulating layer disposed in that order to form multiple layers on a base film. The electro-luminescent light forms a shield layer on the insulating layer and a conductive adhesive layer on the partial regions of the peripheral edge of the shield layer.

Hence the generation of noise due to the application of a high voltage alternating current in the electro-luminescent light can be prevented.

The electro-luminescent light of the present invention is adapted so that at least the luminant layer is not laminated on the partial regions of the peripheral edge of the electro-luminescent light. A conductive adhesive layer is imprinted to those parts corresponding to the partial regions of the peripheral edge of the shield layer.

Hence the generation of cracks in the ruminant layer can be prevented.

The electro-luminescent light of the present invention is adapted so that the shield layer is formed by the printing of carbon ink on top of the insulating layer.

Hence a sufficient shield can be created at a low cost.

SIMPLE EXPLANATION OF THE DRAWINGS

PREFERRED EMBODIMENTS OF THE INVENTION

The preferred embodiments of the invention will be explained in greater detail below making reference to the accompanying figures.

Embodiment 1

Figure 1:
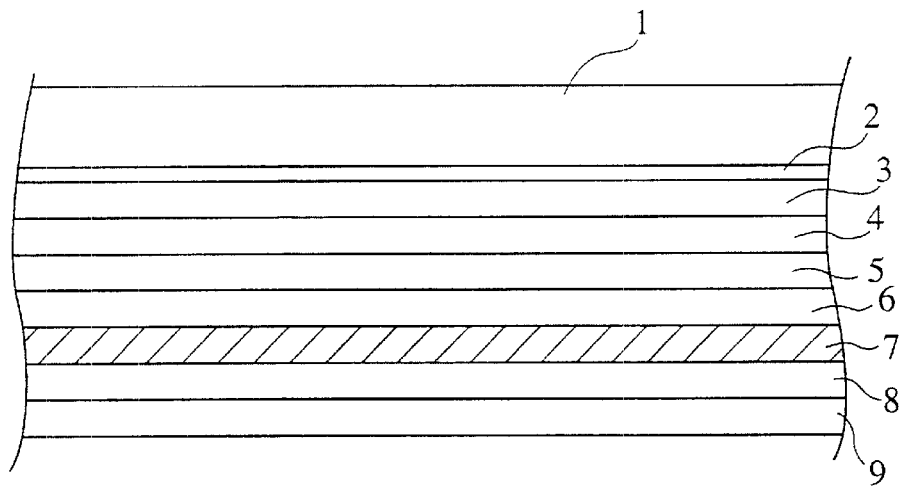
FIG. 1 is a cross section of an EL according to a first embodiment of the present invention.

FIG. 1 is a cross section showing the EL according to a first embodiment of the present invention. Reference numeral 1 denotes a base film, 2 is a transparent electrode laminated on the base film 1, 3 is a luminant layer, 4 is a dielectric layer, 5 is a back plate, 6 is an insulating layer. The elements 1–6 form the EL. 7 is the rear face of the insulating layer, that is to say, it is a shield layer which is laminated onto the shield member on the rear surface of the EL by a process of printing or deposition. 8 is an insulating layer, 9 is an interference material adhered to the rear surface of the insulating-layer-and formed from non-woven fabric.

In other words, the EL is formed from the laminating of each layer shown by the reference numerals 1–6 by a means such as printing. Light is created by excitation of the electrical field by passing a high voltage alternating current between the transference electrode and the back plate which results in the collision of electrons with the luminant layer 3. The shield layer 7 is provided to shield the EL. The interference material 9 is for the purpose of preventing the EL from generating vibration.

Figure 2:
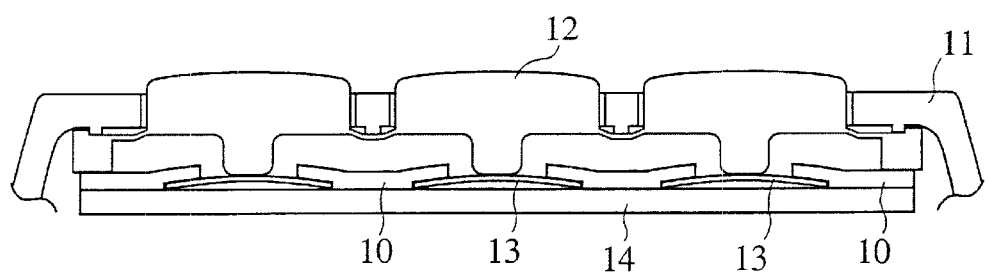
FIG. 2 is a cross section showing the structure of a shield of an EL according to a first embodiment of the present invention.
Figure 3:
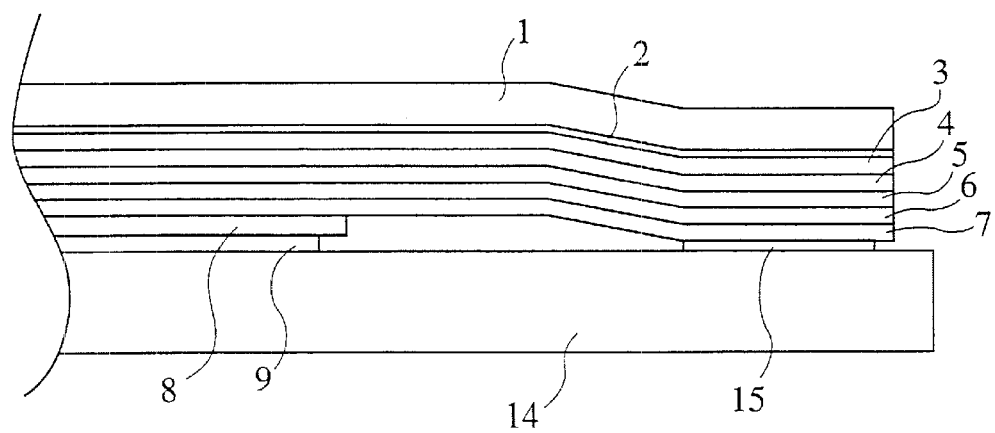
FIG. 3 is an enlarged cross section of the connecting part of the EL and the printed circuit board of a first embodiment of the present invention.

FIG. 2 is a cross section showing the structure of the shield of the EL according to a first embodiment of the present invention which uses the EL shown in FIG. 1 as a source of light to illuminate the key button. FIG. 3 is an enlarged cross section showing the connecting part of the EL with the printed circuit board.

The EL is represented by the reference numeral 10 in FIGS. 2 and 3 and as shown in FIG. 1 has a multi-layered structure on its rear face comprising shield layer 7, insulation layer 8, and 8 interference layer 9. 11 is the case of the electrical device and 12 are the key buttons provided in a plurality of parallel rows on the case 11 of which FIG. 3 only shows three. 13 is a click board corresponding to the protruding parts on the rear face of the key buttons 12. The click board is formed by the depression of the key buttons 12 and places the contact points of the switch (not shown) in the on/off position. 14 is a printed circuit board on which is mounted the wiring pattern or the electrical components comprising the electrical circuit containing the switch circuit of the click board 13. 15 is a conductive adhesive printed onto the shield layer 7 and is shown in FIG. 3 as applied with pressure and heat fused with the circuit board.

In this way, the peripheral edge of the EL 10 as shown in FIG. 2 is on top of the click board 13 on those parts of the click board 13 which are on top of the printed circuit board 14. However as shown in FIG. 3, in those partial regions on which there is no click board 13, the edge of the EL is sealed to the top of the printed circuit board 14.

The operation of the invention will now be explained.

When a high voltage alternating current is passed between the transference electrode 2 and the back plate 5, the EL 10 illuminates and light is emitted from the rear of the key button 12. At this time, if a shield layer 7 is not provided, the high voltage alternating current in the EL 10 will excite electrical components and the switch circuit of the click board 13 mounted on the printed circuit board 14 and result in the generation of noise.

The excitation of the high voltage alternating current in the switch circuit will cause the on/off signals to be reversed and the opposite operation signal to be sent.

However in embodiment 1, as there is a shield layer 7 printed on the rear face of the EL 10, the high voltage alternating current applied to the EL 10 is prevented from exciting the electrical components and the switch circuits on the click board 13 on top of the printed circuit board 14 and the generation of noise is prevented.

Since each of the layers 2–6 are normally printed on the base film 1 when the when the EL is fabricated, after the printing of the insulation layer 6, performance is improved by the printing of the shield layer 7. Performance is further improved by the printing of a conductive adhesive 15 at fixed regions on the peripheral edge of the shield layer 7.

Furthermore according to embodiment 1, since the shield layer 7 and the top of the printed circuit board 14 are in electrical connection due to the conductive adhesive 15, the effect of the shield is improved. In other words, the shield will obviously function even if the top of the printed circuit board 14 and the shield layer 7 are not in electrical contact. It is sufficient to place the shield layer 7 and the top of the printed circuit board 14 or another ground line in electrical contact to obtain the desired result.

It is possible to use silver paste (ink) or a silver and carbon composite paste as a material for printing the shield layer. As a result of much experimentation, it has been found that carbon paste (ink) obtains a sufficient result for the shield layer. On a comparison of the two pastes above, the use of the carbon paste enables a lower cost and marginally reduced weight.

According to embodiment 1 above, the printing of a shield layer 7 on the rear face of the EL 10 prevents the generation of noise in the electronic circuits and the switch circuits of the click board 13 on top of the printed circuit board 14 which is positioned on the rear face of the EL 10. It also improves performance.

Embodiment 2

Figure 4:
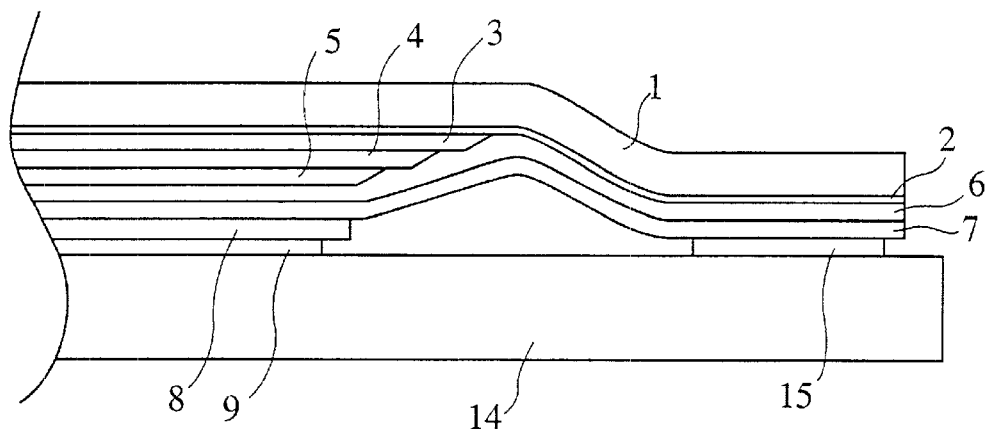
FIG. 4 is an enlarged cross section of the connecting part of the printed circuit board and the EL according to a second embodiment of the present invention.

FIG. 4 is an enlarged cross section showing the connecting part between the EL and the printed circuit board according to a second embodiment of the present invention. In the figure, the same of similar elements are represented by the same numerals as in FIG. 3. In embodiment 2, the ruminant layer 3, the dielectric layer 4 and the back plate 5 which comprise the EL 10 are arranged so as not to overlap with the partial region connecting the ground line of the printed circuit board 14 and the shield layer 7.

In other words, when the ground line of the printed circuit board 14 and the shield layer 7 are placed in contact, heat is applied while pressure is applied from above the base film 1 to the conductive adhesive 15. In such a case, the EL 10 can bend and distort due to the pressure and cracks can form in the ruminant layer 3, the dielectric layer 4 and the back plate 5. In order to prevent the formation of such cracks, the device is adapted so that these layers do not overlap with the partial region connecting the ground line on the printed circuit board 14 and the shield layer 7.

In particular since the adhesion of the transference electrode 2 and the luminant layer 3 is poor and cracks often form in the ruminant layer 3, it is sufficient if only the luminant layer 3 does not overlap.

The same materials used in embodiment 1 to printed the shield layer may be used.

As shown above according to embodiment 2, it is possible to prevent the generation of noise by printing a shield layer 7 on the rear face of the EL 10. Furthermore the formation of cracks in the ruminant layer 3, the dielectric layer 4 and the back plate 5. can be prevented by ensuring that these layers do not overlap in the partial region connecting the shield line on the printed circuit board 14 and the shield layer 7.

Embodiment 3

Figure 5:
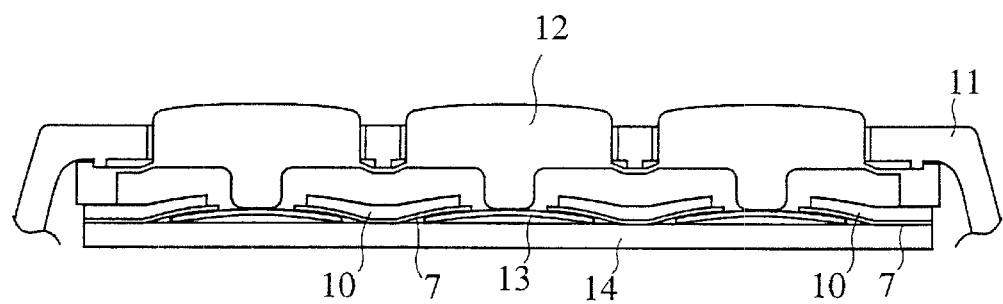
FIG. 5 is a cross section of the structure of a shield of an EL according to a third embodiment of the present invention.

FIG. 5 is a cross section showing the structure of the shield of an EL according to a third embodiment of the present invention. In embodiments 1 and 2 above, the shield layer 7 is provided on the rear face of the EL 10. However in this embodiment, as shown in FIG. 5, the shield layer is provided between the EL 10 and the printed circuit board 14 and between the EL 10 and the click board 13.

Normally the click board 13 is adhered onto the printed circuit board 14. As it has a fixed position and since the bracing seat of the click board can be provided in the same way as the shield layer 7, the shield layer 7 can printed on top of the bracing seat. The bracing seat of the click board secures the click board to the printed circuit board 14 as conventionally known in the art and therefore is not illustrated in the drawing.

According to embodiment 3 above, noise can be prevented by the provision of the shield layer 7 between the EL 10 and the printed circuit board 14 and the EL 10 and the click board 13.

Furthermore assembly including the shield layer 7 is simplified by the printing of the shield layer 7 on top of the bracing seat.

Embodiment 4

Figure 6:
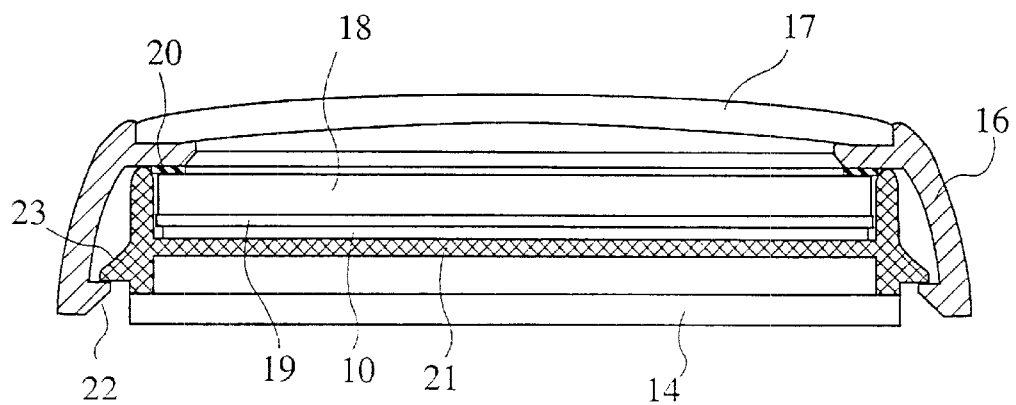
FIG. 6 is a cross section of the structure of the shield of an EL according to a fourth embodiment of the present invention.
Figure 7:
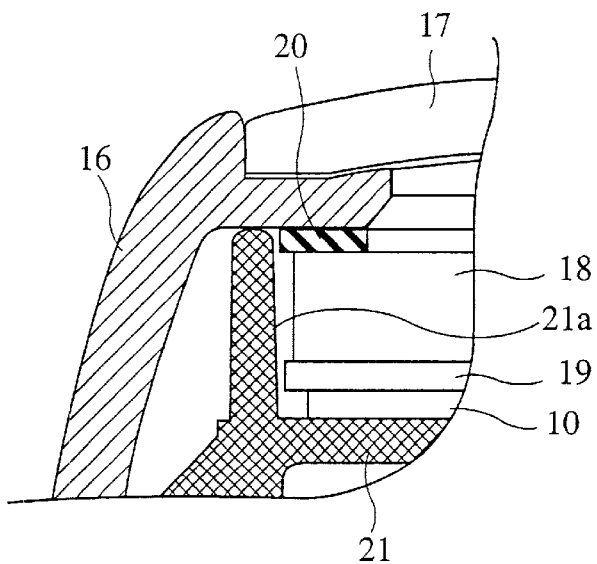
FIG. 7 is an enlarged cross section of the structure of the shield of an EL according to a fourth embodiment of the present invention.

FIG. 6 is a cross section showing the structure of a shield of an EL according to a fourth embodiment of the present invention which is adapted for use in an EL which illuminates a liquid crystal display element. FIG. 7 is an enlarged cross section of FIG. 6.

In FIGS. 6 and 7, reference numeral 16 denotes a case, 17 is a display window provided on the face of the case 16, 18 is a liquid crystal display element which is positioned so that the face on the crystal screen side is opposite the display window 17. 19 is transparent plastic which acts as a positional determination member adhered to the upper face of the EL 10. 10 is an EL which acts as a source of light illuminating the crystal display element 18 from its rear face through the transparent plastic. The EL is comprised from the base film 1, the transparent electrode 2, the illuminant layer 3, the dielectric layer 4, the back plate 5 and the insulation layer 6 as shown in FIG. 1. 20 is a flexible body made from a rubber seat and interposed between the case 16 and the peripheral edge of the crystal display element 18. 21 is a holder which supports the crystal display element 18 through the transparent plastic 19 and the EL 10. Its rear face is formed on the shield member. 14 is a printed circuit board disposed on the lower part of the holder 21 and on which the electrical components which comprise the motive circuits and the like of the liquid crystal display element 18 are mounted. 22 is a pawl provided in the case 16. 23 is a pawl provided in the holder 21 which is engaged with the pawl 22 in the case 16.

The method of assembling the crystal display element will now be explained.

The EL 10, the transparent plastic 19 and the crystal display element 18 are stacked in layers on top of the holder 21. On the very top of these layers is disposed a rubber seat 20. When the holder is pushed into the case 16 in this state, as shown in FIG. 6, the pawl 23 of the holder 21 engages with the pawl 22 of the case 16 and supports the crystal display element 18 in a determined position.

In other words, in embodiment 4, the holder 21 acts as a shield member. Hence the generation of noise due to the high voltage alternating current applied to the EL 10, which excites the printed circuit board 14 is prevented by the shield member formed on the face of the holder 21.

In embodiment 4, the transparent plastic 19 provided as a unit on the EL 10 protrudes from the end face of the EL 10 towards the rib 21a on the end face of the holder 21. Therefore the end face of the EL 10 is formed so as not to contact with the face of the holder 21. Normally since the EL 10 is fabricated in a plurality of flat respective layers and cut to a suitable. size for use, the end face of the EL 10 shows each EL layer as exposed. Hence if the end face of the EL 10 is in contact with the surface of the holder 21, the transferance electrode will be short circuited. In embodiment 4, the transparent plastic 19 determines the position of the EL 10 so that the end face of the EL 10 does not come into contact with the holder 21.

As shown above according to the fourth embodiment of the present invention, the generation of noise due to the application of a high voltage alternating current to the EL 10 can be prevented by the provision of a shield member on the face of the holder 21 provided on the printed circuit board 14 and the EL 10.

Embodiment 5

Figure 8:
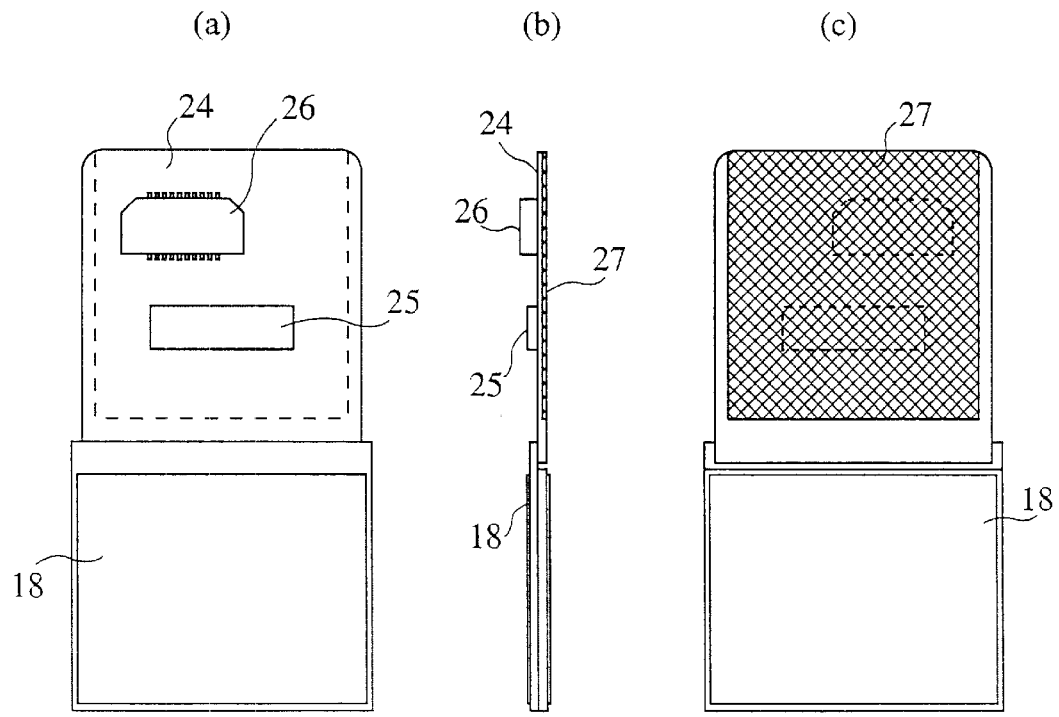
FIG. 8 is a diagram showing the flexible printed board and the crystal display element used in a fifth embodiment of the present invention.
Figure 9:
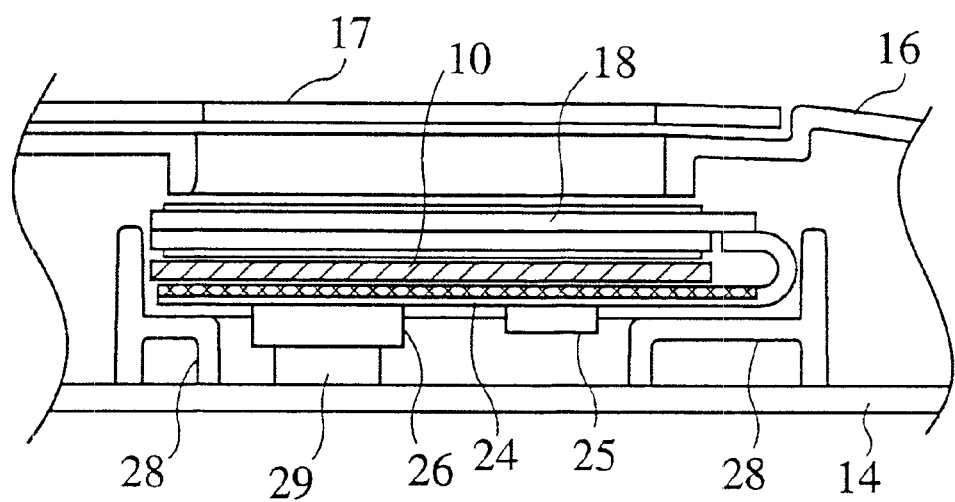
FIG. 9 is a cross section showing the structure of a shield of an EL according to a fifth embodiment of the present invention.

FIG. 8 is a figure showing the flexible printed board and the crystal display element used in a fifth embodiment of the present invention. FIG. 9 is a cross section showing the structure of the shield of the EL according to a fifth embodiment of the present invention. Further FIG. 8(*a*) is a plan view of the flexible printed board on which is mounted the crystal display element and the motive circuits therefor. FIG. 8(*b*) is a side view and FIG. 8(*c*) is a rear view.

In FIG. 8, reference numeral 18 is a crystal display element, 24 is a flexible printed board one end of which is engaged with the end of the crystal display element 18 and on the surface of which is mounted the motive circuits and the like for the crystal display element 18. 25 is a driver IC comprising the motive circuits mounted on the flexible printed board 24, 26 is a connector, 27 is a shield member formed on the rear surface of the flexible printed board 24 and which for example may be formed by aluminum deposition on the rear face of the flexible printed board 24, FIG. 9 shows the crystal display element 18 and the flexible printed board 24, shown in FIG. 8, as assembled in the case with the EL 10. In the figure, 14 is a printed circuit board, 16 is a case, 17 is a display window, 28 is a holder with an aperture formed on its lower face, and which abuts with and supports the EL 10, the crystal display element 18 and the flexible printed board 24 in its interior. The flexible printed board 24 as shown in the figure, is disposed presses against the EL 10 and is bent around the rear face of the crystal display element 18. The shield member 27 on the rear face of the flexible printed board 24 faces the rear face of the EL 10. The upper face of the flexible printed board 2 on which is mounted the driver IC 25, the connector 26 and the like faces the printed circuit board 14 through the aperture in the lower surface of the holder 28. 29 is a connector provided on the top of the printed circuit board 14, and is connected to the connector 26 on top of the flexible printed board 24.

As shown above in accordance with embodiment 5 of the present invention, noise due to the excitation of the electrical circuits such as the motive circuits on the face of the flexible printed board 24 and the electrical circuits on the printed circuit board 14 as a result of the application of a high voltage alternating current in the EL 10 can be prevented by the formation of a shield member 27 on the rear face of the flexible printed board 24.

The embodiment as shown in FIG. 9 provides a flexible printed board 24 and a printed circuit board 14. However all the electrical components can be mounted on the flexible printed board 24 and the printed circuit board 14 can be dispensed with.

Industrial Applicability

As shown above, the EL in accordance with the present invention and the shield structure therefor are adapted to prevent the generation of noise in electronic devices such as mobile telephones due to the application of a high voltage alternating current in the EL.

What is claimed is:

1. An electroluminescent light source for providing a source of electroluminescent light to electronic equipment, comprising:

a printed circuit board on which an electronic circuit component is mounted;

an electroluminescent device, which is disposed in close contact with the printed circuit board and which generates light due to the application of a high voltage alternating current to said electroluminescent device;

a click board disposed on said printed circuit board, said click board switching a switch contact point between on and off positions in response to depression of a key button;

a bracing seat which fixes said click board to said printed circuit board; and a shield member which is disposed between said electroluminescent device and said click board and between said electroluminescent device and said printed circuit board, and which shields said electronic circuit component on said printed circuit board from being excited by the high voltage alternating current applied to the electroluminescent device, said shield member being constructed by a shield layer printed onto said bracing seat.

2. An electroluminescent light source according to claim 1, wherein said shield layer is printed in carbon ink.

3. An electroluminescent light source according to claim 1, wherein said shield member is electrically connected to a ground line printed onto said printed circuit board.

4. An electroluminescent light source according to claim 3, further comprising a conductive adhesive which is printed onto said shield member and which is electrically connected to said ground line by crimping said shield member onto said ground line.

5. An electroluminescent light source for providing a source of electroluminescent light to electronic equipment, comprising:

a printed circuit board on which an electronic circuit component is mounted;

an electroluminescent device, which is disposed in close contact with the printed circuit board and which generates light due to the application of a high voltage alternating current to said electroluminescent device; and a shield member which is disposed between said electroluminescent device and said printed circuit board, and which shields said electronic circuit component on said printed circuit board from being excited by the high voltage alternating current applied to the electroluminescent device;

wherein a luminant layer which is a component of said electroluminescent device is not laminated onto any peripheral regions of said electroluminescent device, said shield member is electrically connected to a ground line printed onto said printed circuit board through a conductive adhesive printed onto a region of said electroluminescent device, and which is electrically connected to said ground line by crimping said shield member onto said ground line.

6. An electroluminescent light source for providing a source of electroluminescent light to electronic equipment, comprising:

an electroluminescent device, which generates light in response to the application of a high voltage alternating current to said electroluminescent device;

a holder, a surface of which is formed of a shield material, and which includes a protrusion formed on a peripheral region of said holder, said protrusion defining a concave region into which said electroluminescent device is placed;

a positional determination member formed of insulating material and being integral with said electroluminescent device, for determining a position of said electroluminescent device such that said electroluminescent device is not in contact. with the surface of the holder; and a printed circuit board on which an electronic component is mounted, said printed circuit board being placed in a location opposite said electroluminescent device relative to said holder.

7. An electroluminescent device having a base film, a transparent electrode, a luminant layer, a dielectric layer, a back plate and an insulation layer, said transparent electrode, said luminant layer, said dielectric layer, said back plate and said insulation layer being layered in sequence on said base film, said electroluminescent device comprising:

a shield layer formed on a side of said insulation layer opposite to said back plate, wherein said luminant layer is not laminated onto any peripheral regions of said electroluminescent device, and a conductive adhesive is printed onto a region of said shield layer corresponding to a peripheral region of said electroluminescent device.

8. An electroluminescent device according to claim 7, wherein said shield layer is formed by printing carbon ink onto said insulation layer.

* * * * *